United States Patent [19]

Slavin

[11] Patent Number: 4,761,640
[45] Date of Patent: Aug. 2, 1988

[54] POSITIONING CURSORS AT SPECIFIC POINTS ON A WAVEFORM DISPLAY

[75] Inventor: Keith R. Slavin, Aloha, Oreg.

[73] Assignee: Tektronix, Inc., Beaverton, Oreg.

[21] Appl. No.: 30,770

[22] Filed: Mar. 24, 1987

[51] Int. Cl.$^4$ .................. G01R 13/30; G09G 3/02
[52] U.S. Cl. ..................... 340/709; 340/721; 324/103 P; 324/121 R; 364/487
[58] Field of Search .......... 324/121 R, 103 P; 340/709, 721, 722, 734; 364/487

[56] References Cited

U.S. PATENT DOCUMENTS

| | | | |
|---|---|---|---|
| 4,476,432 | 10/1984 | Olson | 324/121 R |
| 4,628,254 | 12/1986 | Bristol | 324/121 R |
| 4,686,523 | 8/1987 | Bristol | 340/709 |

*Primary Examiner*—Howard A. Birmiel
*Attorney, Agent, or Firm*—Francis I. Gray

[57] ABSTRACT

A method for positioning cursors at a specific point on a displayed waveform uses a cursor to determine the maximum and minimum points on the waveform about a transition portion. For each position of the cursor between the maximum and minimum points an intersection between the cursor and the waveform is computed as a percentage of the difference between the maximum and minimum points. The cursor is then positioned at a point on the transition portion where the percentage is a desired value for the specific point.

1 Claim, 3 Drawing Sheets

POSITIONING CURSORS AT SPECIFIC POINTS ON A WAVEFORM DISPLAY

BACKGROUND OF THE INVENTION

The present invention relates to cursors on a waveform display, and more particularly to a method for positioning cursors at specific points on a waveform display in order to perform accurate measurements.

In measuring parameters of a repetitive waveform, such as a television video signal, the measurement is defined as being between specific points on the displayed waveform, such as the fifty percent point of the leading edge of a horizontal sync pulse. In prior analog devices, such as television waveform monitors, the location of the point from which, or points between which, a measurement is made is dependent upon the skill of the operator in eyeballing the desired point and reading from a calibrated graticule the necessary parameters for the measurement. This resulted in measurements which were approximate only, with the accuracy being dependent upon the experience and skill of the operator.

What is desired is a method for accurately positioning cursors at precise specified points on a displayed waveform in order to make the reading of parameters and resulting measurements of the waveform independent of the skill of the operator.

SUMMARY OF THE INVENTION

Accordingly the present invention provides a method for positioning cursors at specified points on a waveform display by determining the maximum and minimum values about a transition portion of the waveform. A cursor is moved first to one extreme amplitude of the displayed waveform, and a first place on the waveform is stored. The cursor is then moved to the opposite extreme amplitude of the displayed waveform at the transition portion, and a second place is stored. The cursor is then moved between the two extreme points and a percentage amplitude value for the waveform at the cursor position is computed and displayed. The operator moves the cursor to a point on the waveform at which the percentage value displayed is at the desired value for the desired measurement point.

The objects, advantages and other novel features of the present invention will be apparent from the following detailed description when read in conjunction with the appended claims and attached drawing.

DESCRIPTION OF THE PREFERRED EMBODIMENT

Figure 1:
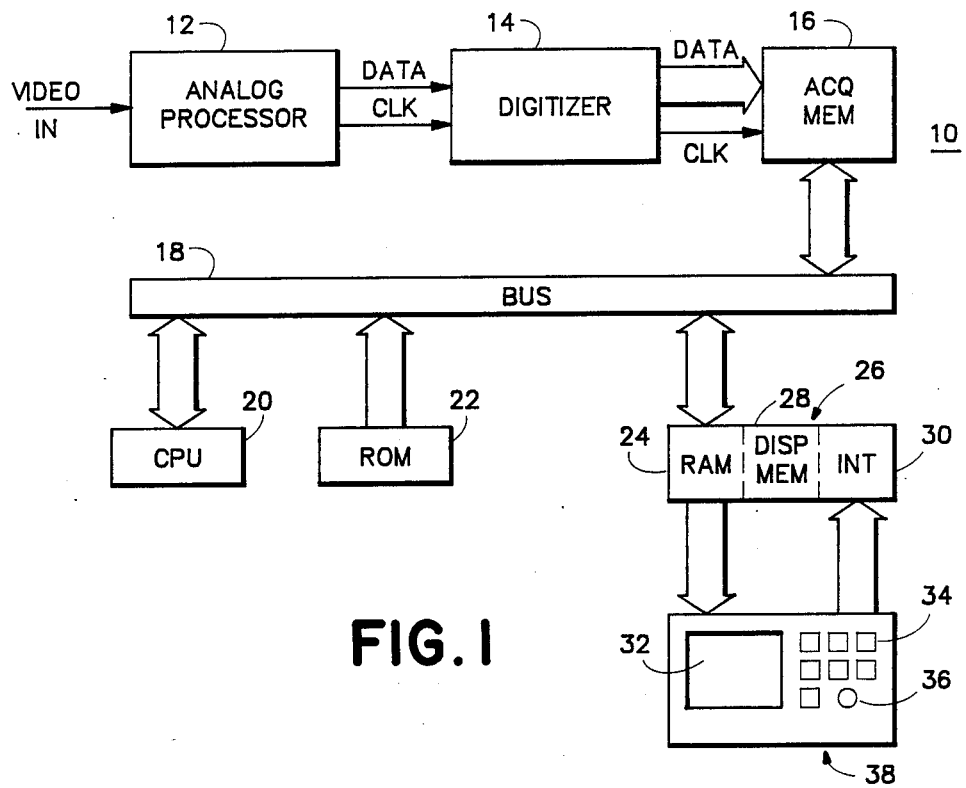
FIG. 1 is a block diagram of an instrument using the cursor positioning method of the present invention.
Figure 2:
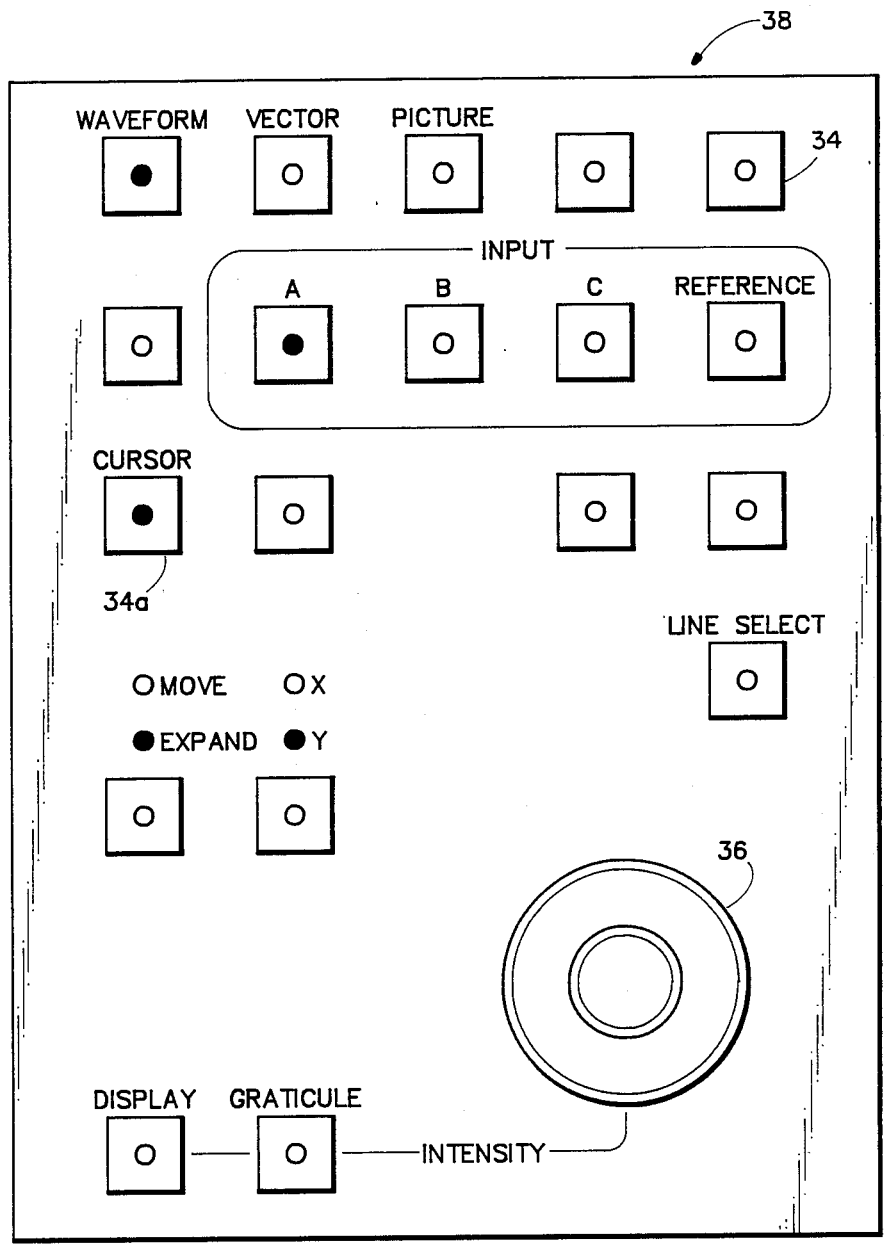
FIG. 2 is a plan view of the front panel for the instrument of FIG. 1.

Referring now to FIGS. 1 and 2 an instrument 10 is shown having a video input signal, such as a television video signal. The video signal is conventionally processed in the analog domain by an analog processor 12, digitized by a digitizer 14, and stored in an acquisition memory 16. The acquisition memory 16 is connected to a communications bus 18 to which also are connected a central processing unit (CPU) 20 with associated ROM 22 and RAM 24, and a display interface unit 26. The display interface unit 26 includes the RAM 24, a display memory 28 and an interface circuit 30. The contents of the display memory 28 are displayed on a screen 32. The digitized video data from the acquisition memory 16 is processed by the CPU 20 according to the functions and parameters input by an operator via function buttons 34 and a rotary encoder knob 36 on a front panel 38, and via interaction with the screen 32. The processed data is stored in the display memory 28 together with appropriate scales, cursors and display information. A CURSOR function button 34a selects the cursor mode, and the rotary encoder 36 serves to position a displayed waveform 40 relative to a displayed cursor 42.

Figure 3:
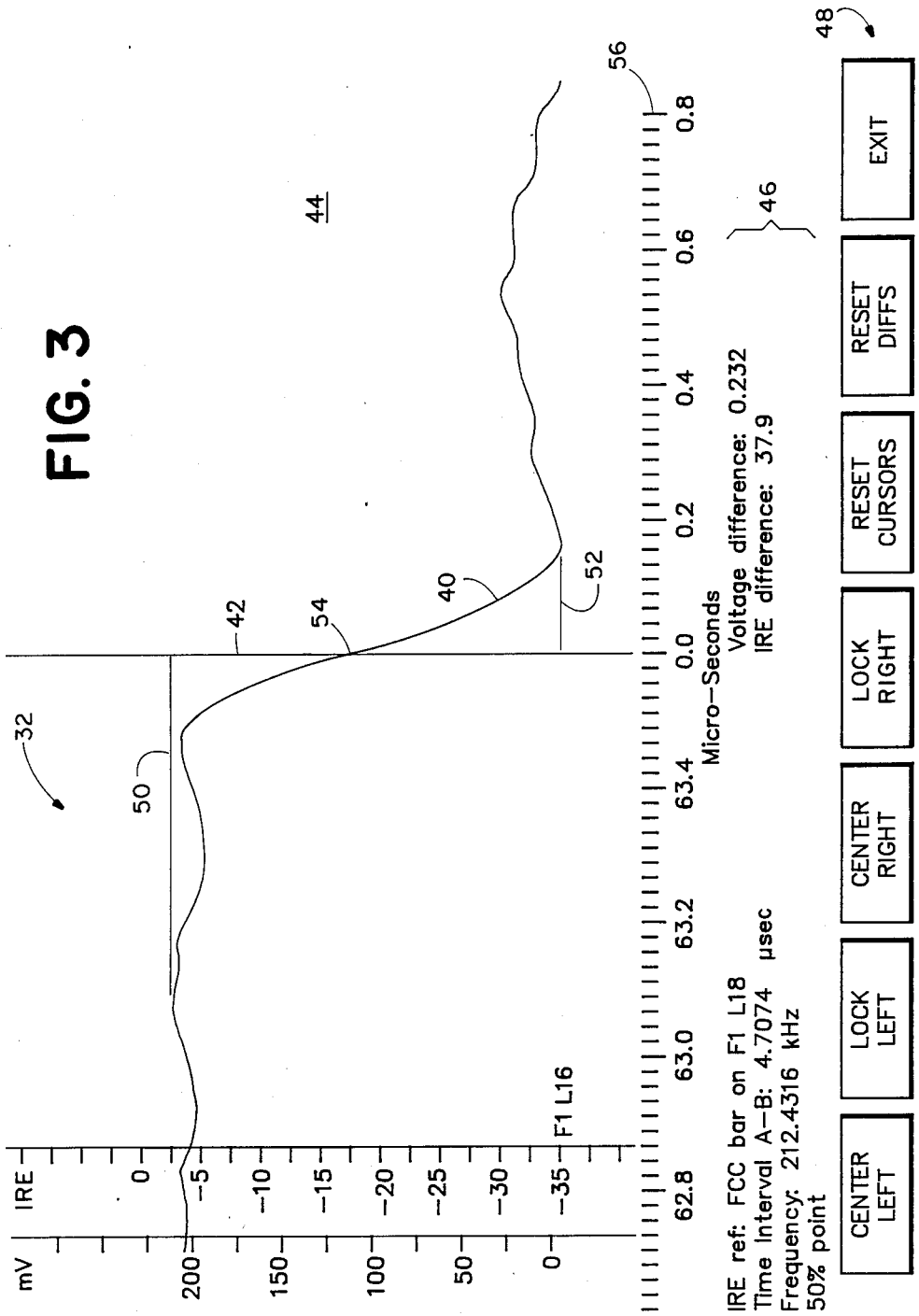
FIG. 3 is a plan view of the display screen for the instrument of FIG. 1 illustrating the cursor positioning method of the present invention.

As shown in FIG. 3 in the cursor mode there appears on the screen 32 a display area 44 in which the waveform 40 appears, an information area 46 in which appropriate measured values are displayed, and a command area 48 in which "soft" keys are displayed which are suitable for use with a touch screen. By rotating the rotary encoder 36 the cursor 42 is positioned relative to the waveform 40 at an extreme amplitude about a transition in the waveform, such as at the leading edge of horizontal sync as shown in FIG. 3. As the cursor is moved from the first extreme point a tick line 50 extends from the extreme point to the cursor and the amplitude value represented by the tick line is stored by the CPU 20. The cursor 42 is then moved relative to the waveform 40 to the opposite extreme amplitude position, and as the cursor is moved from that position back toward the first position a second tick line 52, representing the second extreme amplitude value which is stored by the CPU 20, extends from that extreme point to the cursor. With the values at the extreme amplitude positions the CPU 20 computes the position of the cursor 42 between these points at the point 54 where the cursor intersects the waveform 40 as a percentage of the amplitude between the extreme amplitude values represented by the tick lines 50, 52. This percentage is displayed in the information area 46 of the screen 32. By positioning the cursor 42 while observing the displayed percentage an operator can accurately position the cursor at any desired point of the transition. For example the cursor 42 can be accurately positioned at the horizontal sync point, defined as the fifty percent point of the leading edge as shown in FIG. 3, or at the ten and ninety percent points using two cursors to determine slew rate of the transition from the difference in time shown on a horizontal time scale 56.

Thus the present invention provides a method for positioning cursors at specific points on a waveform display by computing a percentage intersection point with the waveform based upon a maximum and a minimum value determined by movement of a cursor about a transition in the waveform.

What is claimed is:

1. A method for positioning a vertical cursor at a specific point of a waveform on a display comprising the steps of:
    positioning the vertical cursor relative to the waveform at an extreme amplitude point of a transition in the waveform to store a first value representing such extreme amplitude point;
    positioning the vertical cursor relative to the waveform at an opposite extreme amplitude point of the transition in the waveform to store a second value representing such opposite extreme amplitude point;

computing and displaying for each position of the vertical cursor with respect to the waveform between the extreme amplitude points a third value as a percentage of the difference between the first and second values; and positioning the vertical cursor relative to the waveform at a point on the waveform where the percentage is a desired value for the specific point.

* * * * *